United States Patent [19]
Chee et al.

[11] Patent Number: 5,966,607
[45] Date of Patent: Oct. 12, 1999

[54] METAL SALICIDE PROCESS EMPLOYING ION METAL PLASMA DEPOSITION

[75] Inventors: Lay Chee; Abdalla Naem, both of Sunnyvale, Calif.

[73] Assignee: National Semicoinductor Corporation, Santa Clara, Calif.

[21] Appl. No.: 09/001,531

[22] Filed: Dec. 31, 1997

[51] Int. Cl.$^6$ .................................. H01L 21/336
[52] U.S. Cl. .................. 438/305; 438/303; 438/592; 438/685; 438/686
[58] Field of Search .................. 438/303, 305, 438/592, 685, 686

[56] References Cited

U.S. PATENT DOCUMENTS 5,858,849  1/1999  Chen ........................... 438/301

OTHER PUBLICATIONS

Dixit, G. a. et al, Ion Metal Plasma (IMP) Deposited Titanium Liners for 0.25/0.18 μm Multilevel Interconnections, IEEE pp. 357–360 (1996). no month.

Wolf, S. et al., *Silicon Processing for the VLSI Era I*, pp. 397–399, (Lattice Press 1986). no month.

*Primary Examiner*—John F. Niebling
*Assistant Examiner*—Alexander G. Ghyka
*Attorney, Agent, or Firm*—Limbach & Limbach L.L.P.

[57] ABSTRACT

A process for forming metal salicide layers on an MOS transistor structure that reduces the risk of forming metal silicide bridges between source/drain regions and a polysilicon gate. The process includes the use of a uni-directional ion metal plasma deposition step to deposit a metal layer on the surface of a MOS transistor structure such that the ratio of the metal layer thickness on the surface of a gate sidewall spacers to the metal layer thickness on the surface of a polysilicon gate is no greater than 0.2. The relatively thin metal layer on the surface of the gate sidewall spacer reduces the possibility of forming metal silicide defects.

14 Claims, 3 Drawing Sheets

METAL SALICIDE PROCESS EMPLOYING ION METAL PLASMA DEPOSITION

BACKGROUND OF THE INVENTION

1. Field of the Invention

The present invention relates to processes for the formation of metal salicide layers during semiconductor device fabrication and, in particular, to such a process that includes a step of depositing a metal layer by ion metal plasma deposition and that provides for a reduced risk of metal silicide bridging defects.

2. Description of the Related Art

In Metal-Oxide-Semiconductor (MOS) device manufacturing, self-aligned metal silicide layers (also known as a "salicide" layers) are useful in reducing the sheet resistance of polysilicon interconnections, source regions and drains regions, as well as contact resistance. See, for example, Stanley Wolf et al., *Silicon Processing for the VLSI Era I,* 388–399 (Lattice Press 1986).

FIGS. 1–3 illustrate a conventional process for forming a metal salicide layer over a polysilicon gate, a source region and a drain region of an MOS transistor structure.

FIG. 1 illustrates a representative conventional MOS transistor structure 10. The MOS transistor structure 10 includes a thin gate oxide 12 overlying P-type silicon substrate 14 between N-type drain region 16 and N-type source region 18, both of which are formed in P-type silicon substrate 14. A polysilicon gate 20 overlies thin gate oxide 12, and field oxide regions 22 isolate MOS transistor structure 10 from neighboring device structures (not shown). Gate sidewall spacers 24, typically of silicon dioxide or silicon nitride, are formed on the sides of polysilicon gate 20 and thin gate oxide 12.

As illustrated in FIG. 2, in the first step of a conventional metal salicide formation process, a metal layer 28 is deposited over the surface of MOS transistor device 10. Metal layer 28 is conventionally deposited by a multi-directional evaporative or sputtering-based physical vapor deposition (PVD) process or a multi-directional chemical vapor deposition (CVD) process and is, therefore, of essentially equal thickness over the entire surface of MOS transistor structure 10.

Wherever metal layer 28 is in contact with silicon surfaces (i.e. source region 18, drain region 16 and the polysilicon surface of polysilicon gate 20) the metal is reacted to form a metal salicide layer. The conditions, such as temperature and gaseous ambient, employed for such a metal reaction are chosen to foster the reaction of the metal layer with these regions which have silicon surfaces while impeding reaction of the metal layer with the silicon dioxide or silicon nitride surfaces (i.e. the gate sidewall spacers and field oxide regions).

A selective etch is then used to remove unreacted metal from the surface of the gate sidewall spacers and field oxide regions, as well as any unreacted metal residue still remaining above the source region, drain region and polysilicon gate. The etch is "selective" since it does not remove the metal salicide layer that was formed on the surface of the silicon and polysilicon regions. The result, illustrated in FIG. 3, is a metal salicide layer 32 on the surface of drain region 16, a metal salicide layer 34 on the surface of source region 18 and a metal salicide layer 36 on the surface of polysilicon gate 20.

A drawback of conventional metal salicide processes is the tendency to form metal silicide "bridges" 40 between the salicide layer on source region 18, or drain region 16, and the salicide layer on the polysilicon gate, as shown in FIG. 4. Metal silicide bridges cause an undesirable electrical short between these regions.

Needed in the art is a process for forming a self-aligned metal silicide layer on an MOS transistor structure that provides a reduced susceptibility to the formation of metal silicide bridging defects.

SUMMARY OF THE INVENTION

The present invention provides a process for forming self-aligned metal silicide layers on an MOS transistor structure that reduces the risk of metal silicide bridging defects.

The process according to the present invention includes first providing an MOS transistor structure including a silicon substrate (typically P-type), a thin gate oxide layer on the surface of the silicon substrate and a polysilicon gate overlying the thin gate oxide layer. The MOS transistor structure also includes source and drain regions (typically N-type) disposed in the silicon substrate on either side of the polysilicon gate. Two gate sidewall spacers (typically fabricated of silicon nitride or silicon dioxide) abut the sides of the polysilicon gate and thin gate oxide and overly the source and drain regions.

A metal layer is then deposited over the MOS transistor structure using an ion metal plasma process. The ion metal plasma process deposits metal in a uni-directional manner such that the ratio of the deposited metal layer thickness on a surface of the gate sidewall spacers to the deposited metal layer thickness on a surface of the polysilicon structure is no greater than 0.2, thereby depositing a relatively thin metal layer on the surface of the gate sidewall spacers. Attainment of this 0.2 ratio via an ion metal plasma deposition step is facilitated when the surface of each of the gate sidewall spacers has a near vertical profile of between 80 and 90 degrees with respect to the surface of the silicon substrate.

Next, metal in the metal layer, that is in contact with silicon from the source region, the drain region and the polysilicon gate, is reacted to yield self-aligned metal silicide layers on these regions. Any unreacted metal on these regions is subsequently removed. The metal layer on the gate sidewall spacers and field oxide regions remain unaffected. Since the metal layer on the surface of the gate sidewall spacers is relatively thin, the possibility of forming metal silicide bridging defects between the salicide layer on the source and drain regions and the salicide layer on the polysilicon gate is reduced. The metal layer on the gate sidewall spacers and field oxide regions is also subsequently removed.

In one embodiment, the metal layer is composed of titanium and is reacted with silicon from the source region, drain region and polysilicon gate in the presence of nitrogen gas, to form a titanium nitride layer in addition to titanium silicide layer. Nitrogen diffuses through and reacts with the entire thin layer of the titanium metal layer on the surface of the gate sidewall spacers, thereby completely converting the layer into titanium nitride. The titanium nitride layer suppresses the growth of metal silicide bridging defects along the surface of the gate sidewall spacers.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings, of which.

DETAILED DESCRIPTION

FIGS. 5–8 illustrate stages of a process for forming a self-aligned metal silicide layer on an MOS transistor structure according to the present invention.

Figure 1:
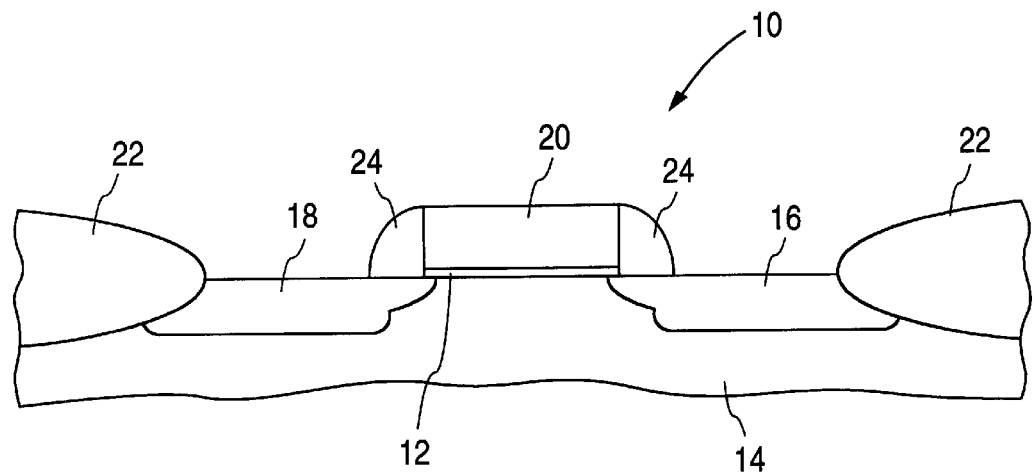
FIG. 1 is a cross-sectional view illustrating a conventional MOS transistor structure prior to the deposition of a metal layer during salicide formation.
Figure 2:
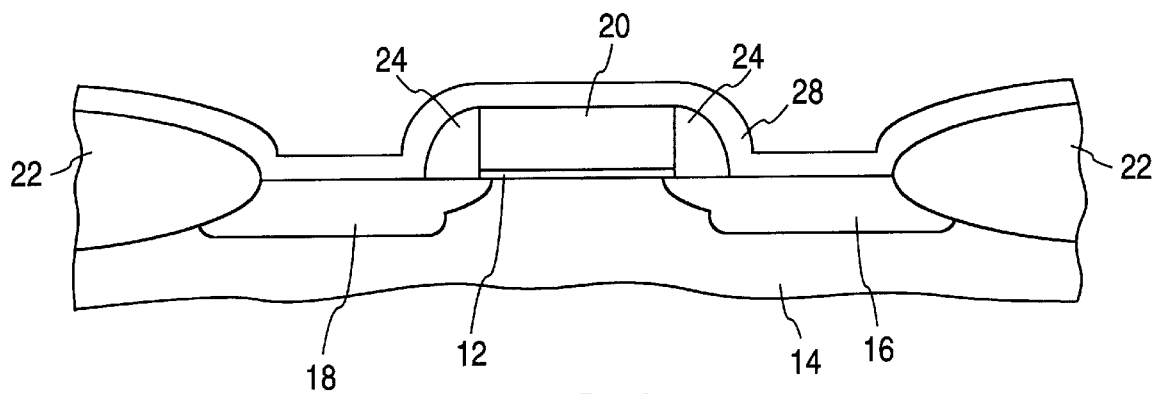
FIG. 2 is a cross-sectional view depicting a conventional MOS transistor structure after deposition of a metal layer by conventional PVD methods.
Figure 3:
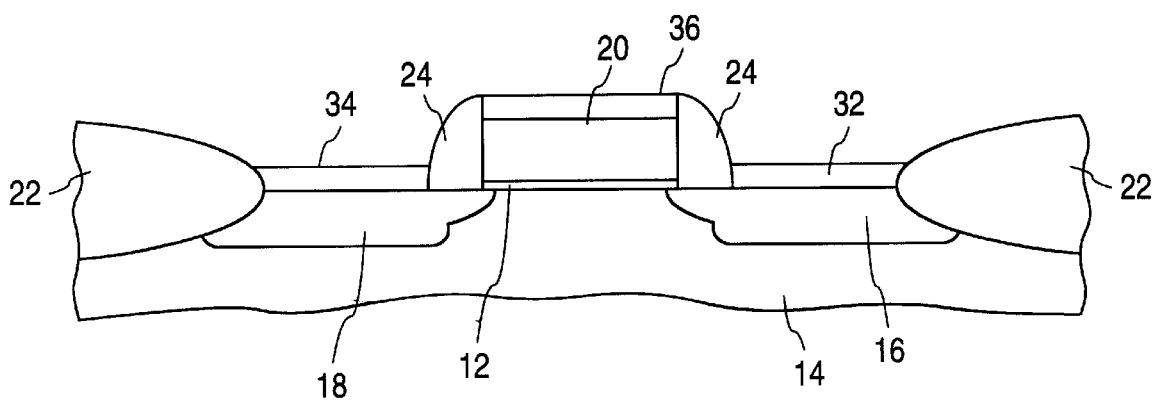
FIG. 3 is a cross-sectional view showing a conventional MOS transistor structure after reacting the metal layer with the silicon surfaces of the source and drain regions and the polysilicon surface of the polysilicon gate.
Figure 4:
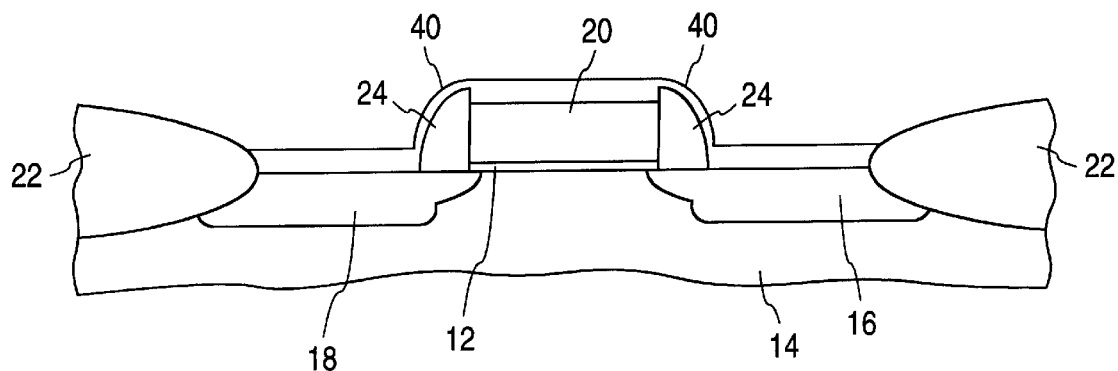
FIG. 4 is a cross-sectional view illustrating a conventional MOS transistor structure with a salicide layer and metal silicide bridging.
Figure 5:
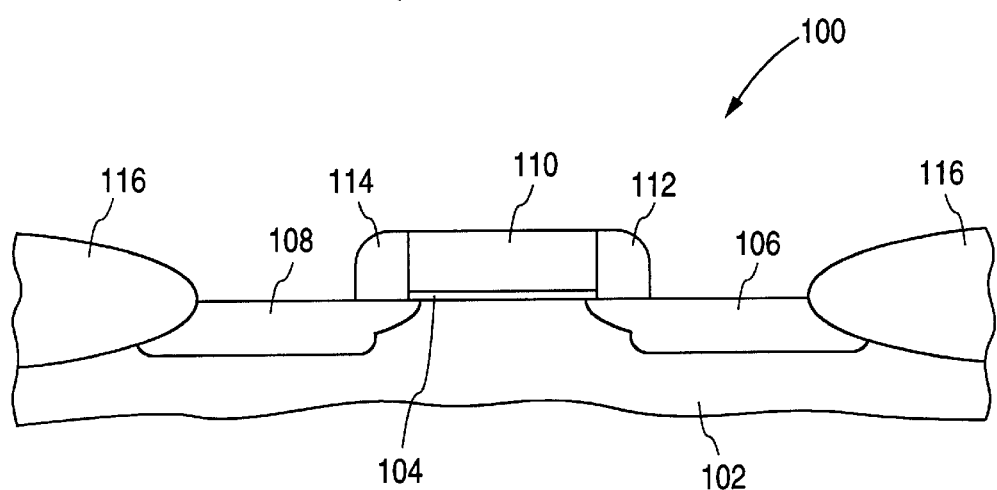
FIG. 5 is a cross-sectional view of a MOS transistor structure following the step of providing a MOS device structure of a process in accordance with the present invention.

Referring to FIG. 5, the process includes first providing a MOS transistor structure 100 that includes silicon substrate 102 of a first conductivity type, typically P-type. The MOS transistor structure 100 also includes a thin gate oxide layer 104 (typically less than 100 angstroms thick) overlying silicon substrate 102 between drain region 106 and source region 108, both of which are formed in silicon substrate 102. Drain region 106 and source region 108 are of a conductivity type opposite that of silicon substrate 102. A polysilicon gate 110 (typical thickness being in the range between 2000 and 3000 angstroms) overlies thin gate oxide layer 104.

MOS transistor structure 100 also includes first gate sidewall spacer 112 and second gate sidewall spacer 114, both of which abut the sides of polysilicon gate 110 and thin gate oxide layer 104. In addition, first gate sidewall spacer 112 extends over drain region 106, while second gate sidewall spacer 114 extends over source region 108. These gate sidewall spacers are made, for example, of CVD silicon nitride or silicon dioxide and have a typical width in the range of 1000 to 1400 angstroms. Field oxide regions 116 separate MOS transistor structure 100 from adjacent MOS transistor structures (not shown).

For reasons that will be discussed below, it is preferred that the profile of the gate sidewall surface be near vertical, with a preferred angle between the side surface of the gate sidewall spacers and the surface of the source or drain region being between 80 and 90 degrees. Near vertical gate sidewall profiles can be obtained by using a conventional anisotropic plasma etch, the details of which are known to those skilled in the art.

Figure 6:
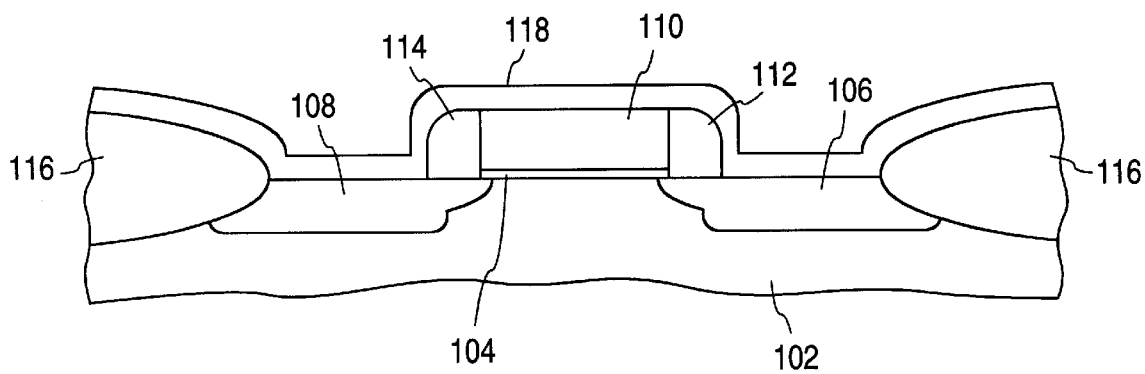
FIG. 6 is a cross-sectional view of a MOS transistor device structure following the step of depositing a metal layer using an ion metal plasma deposition process of a process in accordance with the present invention.
Figure 7:
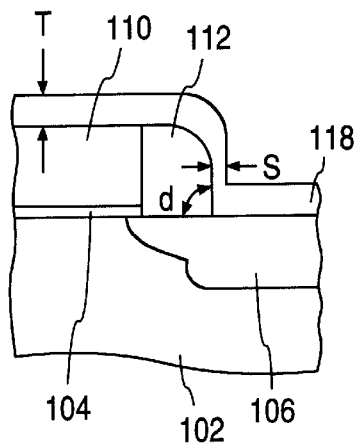
FIG. 7 is an enlarged cross-sectional view of a portion of FIG. 6.

Next, titanium metal layer 118 is deposited on the surface of drain region 106, source region 108, polysilicon gate 110, field oxide regions 116 and gate sidewall spacers 112 and 114. The resultant structure is illustrated in FIGS. 6 and 7. Deposition of a titanium metal layer in accordance with the present invention is accomplished by an ion metal plasma process. The uni-directionality (i.e. perpendicular to the silicon substrate surface) of the deposition of metal ions, that is unique to the ion metal plasma process, produces a relatively thin metal layer on the near-vertical lateral surface of the gate sidewall spacers 112 and 114, while a relatively thick metal layer is produced on the source region 108, drain region 106 and polysilicon gate 110. The thin titanium layer decreases the possibility of titanium silicide formation along the gate sidewall spacers, thereby reducing the occurrence of metal silicide bridging defects between the source/drain region and the polysilicon gate. It is preferred that the ratio of the metal layer thickness on the near-vertical lateral surface of the gate sidewall spacer to the metal layer thickness on the polysilicon gate surface be no more than 0.2. A typical metal layer thickness on the polysilicon gate is less than 500 angstroms while that on the near-vertical lateral surface of the gate sidewall spacer is less than 100 angstroms.

The relative thickness of the metal layers on the polysilicon gate and the lateral surface of the gate sidewall spacer in accordance with the present invention can be readily understood by reference to FIG. 7. In that figure, dimensions T and S respectively represent the thickness of the metal layer on the polysilicon and the thickness of the metal layer on the near-vertical lateral surface of the gate sidewall spacer, with the thickness ratio of S to T ("S/T ratio") being less than 0.2. Angle α represents the angle between the lateral surface of gate sidewall spacer 112 and the surface of silicon substrate 102. An angle between 80 and 90 degrees insures the desired S/T ratio of 0.2 or less.

In the ion metal plasma deposition process, an inductively coupled plasma source is used to produce a high density ion metal plasma in a conventional PVD chamber. Metal atoms are sputtered off of a target in the chamber and are ionized upon entering the plasma. The ionized metal atoms are then accelerated toward the surfaces of a MOS transistor structure on a biased chuck in a uni-directional manner. The resultant metal deposition is uni-directional and perpendicular to the silicon substrate of the MOS transistor structure. See G. A. Dixit, et al., *Ion Metal Plasma (IMP) Deposited Titanium Liners for 0.25/0.18 μm Multilevel Interconnections*, IEDM, 357–360 (1996), which is hereby fully incorporated by reference. Typical ion metal plasma deposition process conditions are a pressure of 22.5 mTorr, an RF power of 2.5 kW, a DC power of 2 kW and an Argon gas flow rate of 65 sccm. Prior to the present invention, the ion metal plasma deposition technique was only known to be useful in depositing metal liners into high aspect ratio contacts and vias, while its beneficial use in a salicide formation process that results in reduced metal silicide bridging defects on gate sidewall spacers was not recognized.

Following the deposition of titanium metal layer 118, titanium metal in the metal layer 118 that is in contact with silicon from the surface of source region 108, drain region 106 and polysilicon gate 110 is reacted to produce self-aligned metal silicide layers (i.e. salicide) on these regions. The titanium metal layer on the gate sidewall spacers and field oxide regions remain unaffected.

The salicide formation reaction can be conducted using procedures well known to those skilled in the art. Typical procedures employ elevated temperatures, around 675–700° C., to foster the reaction and are conducted in a rapid thermal processor (RTP), such as an AG 8108 RTP, available from AG Associates.

Figure 8:
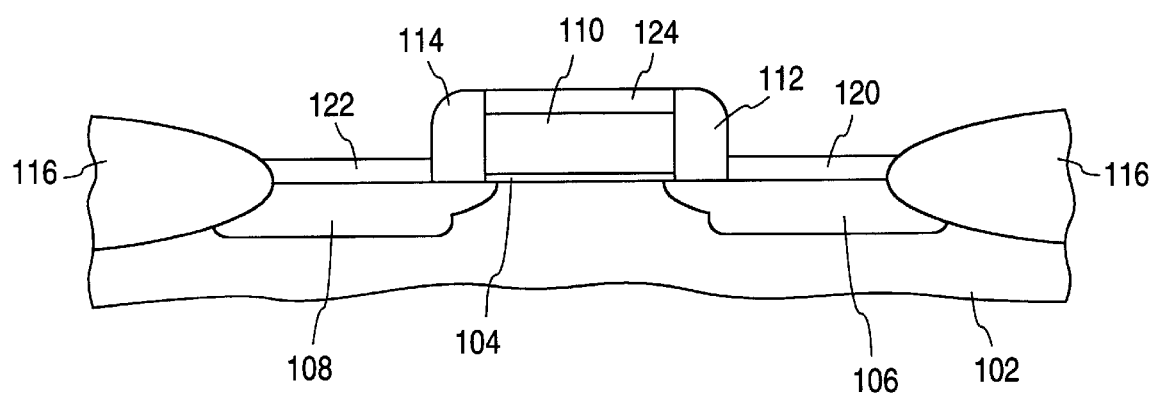
FIG. 8 is a cross-sectional view of a MOS transistor structure following the steps of reacting metal in the metal layer with silicon and removing the unreacted metal of a process in accordance with the present invention.

Next, the titanium metal layer on the gate sidewall spacers and field oxide regions, as well as any unreacted titanium metal on the source region, drain region and polysilicon gate, is removed from the surface of MOS transistor structure 100. The removal is accomplished by a conventional selective wet etch such as a mixture of $H_2O$, $H_2O_2$ and $NH_4OH$. The result, illustrated in FIG. 8, is a metal salicide layer 120 on the surface of drain region 106, a metal salicide layer 122 on the surface of source region 108 and a metal salicide layer 124 on the surface of polysilicon gate 110.

In one embodiment, the step of reacting titanium in the titanium metal layer with silicon to form titanium silicide is conducted in a nitrogen ambient. The presence of nitrogen results in the production of a titanium nitride layer at the surface and in the near surface regions of titanium metal layer, as well as the absorption of nitrogen into the titanium metal layer. The absorption of nitrogen and the formation of titanium nitride in the titanium metal layer suppress lateral silicide formation along the gate sidewall spacers that can lead to metal bridging defects (see, *Silicon Processing for the VLSI Era I*, pp 398–399). Due to its thinness, essentially all of the titanium metal layer on the near-vertical lateral surface of the gate sidewall spacer will be converted to titanium nitride during the aforementioned metal reaction step. The titanium nitride layer then serves to block diffusion of silicon along the gate sidewall spacer surface, thereby impeding its conversion to a titanium silicide bridging defect. The titanium nitride layer formed on the surface of the gate sidewall spacer, as well as any titanium nitride that forms on the upper surface of the titanium metal layer that covers the source region, drain region and polysilicon gate, is subsequently removed upon removal of unreacted titanium.

In another embodiment, other metals capable of forming a metal silicide can be substituted for titanium in the metal layer. These metals include, but not limited to, cobalt, molybdenum, tungsten, nickel, platinum, palladium and tantalum, with the only requirement being that the metal can be deposited in a uni-directional manner by an ion metal plasma deposition process.

It should be understood that various alternatives to the embodiments of the invention described herein may be employed in practicing the invention. It is intended that the following claims define the scope of the invention and that processes and structures within the scope of these claims and their equivalents by covered thereby.

What is claimed is:

1. A method for forming self-aligned metal silicide layers on an MOS transistor structure comprising the steps of:

providing an MOS transistor structure including:

a silicon substrate of a first conductivity type;

a thin gate oxide layer disposed on the silicon substrate, the thin gate oxide layer having two sides;

a polysilicon gate overlying the thin gate oxide layer, the polysilicon gate having two sides;

source and drain regions of a second conductivity type in the silicon substrate;

a first gate sidewall spacer overlying the source region and abutting one side of the polysilicon gate and the thin gate oxide layer, the first gate sidewall spacer having a lateral surface; and a second gate sidewall spacer overlying the drain region and abutting the other side of the polysilicon gate and the thin oxide layer opposite the first gate sidewall spacer, the second gate sidewall spacer having a lateral surface;

depositing a metal layer on the source region, the drain region, the polysilicon gate and the first and second gate sidewall spacers, using an ion metal plasma process with a ratio of the metal layer thickness on the lateral surface of the first and second gate sidewall spacers to the metal layer thickness on the polysilicon gate being less than 0.2;

reacting metal in the metal layer with silicon in the source region, the drain region and the polysilicon gate to yield self-aligned metal silicide layers on the source region, drain region and polysilicon gate; and removing any unreacted metal.

2. The method of claim 1 wherein the step of providing a MOS transistor structure includes providing first and second gate sidewall spacers having a lateral surface at an angle of between 80 and 90 degrees with respect to the silicon substrate.

3. The method of claim 2 wherein the step of depositing a layer of metal includes depositing a layer of metal with a thickness of less than 500 angstroms on the source region, the drain region and the polysilicon gate and a thickness of less than 100 angstroms on the lateral surface of the first and second gate sidewall spacers.

4. The method of claim 1 wherein the step of depositing a metal layer includes depositing a titanium metal layer.

5. The method of claim 4 wherein the step of reacting metal further includes reacting titanium metal in the metal layer with nitrogen gas to form a titanium nitride layer.

6. The method of claim 1 wherein the step of depositing a metal layer includes depositing a cobalt metal layer.

7. The method of claim 1 wherein the step of depositing a metal layer includes depositing a molybdenum metal layer.

8. The method of claim 1 wherein the step of depositing a metal layer includes depositing a tungsten metal layer.

9. The method of claim 1 wherein the step of depositing a metal layer includes depositing a nickel metal layer.

10. The method of claim 1 wherein the step of depositing a metal layer includes depositing a platinum metal layer.

11. The method of claim 1 wherein the step of depositing a metal layer includes depositing a palladium metal layer.

12. The method of claim 1 wherein the step of depositing a metal layer includes depositing a tantalum metal layer.

13. The method of claim 1 wherein the step of providing an MOS transistor structure includes providing first and second gate sidewall spacers made of silicon nitride.

14. The method of claim 1 wherein the step of providing an MOS transistor structure includes providing first and second gate sidewall spacers made of silicon dioxide.

* * * * *

UNITED STATES PATENT AND TRADEMARK OFFICE
CERTIFICATE OF CORRECTION

PATENT NO. : 5,966,607
DATED : October 12, 1999
INVENTOR(S) : LAY CHEE ET AL.

It is certified that error appears in the above-identified patent and that said Letters Patent is hereby corrected as shown below:

On the cover page at "[73]", delete "National Semicoinductor Corporation" and replace with --National Semiconductor Corporation--.

Signed and Sealed this

Twenty-eighth Day of March, 2000

Attest:

Q. TODD DICKINSON

*Attesting Officer*     *Commissioner of Patents and Trademarks*